United States Patent
Kimura

(10) Patent No.: US 8,212,257 B2
(45) Date of Patent: Jul. 3, 2012

(54) SEMICONDUCTOR DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/630,869

(22) Filed: Dec. 4, 2009

(65) Prior Publication Data
US 2010/0141621 A1    Jun. 10, 2010

Related U.S. Application Data

(63) Continuation of application No. 10/914,081, filed on Aug. 10, 2004, now Pat. No. 7,629,612, which is a continuation of application No. 10/198,693, filed on Jul. 16, 2002, now Pat. No. 6,774,419.

(30) Foreign Application Priority Data

Aug. 10, 2001 (JP) .................................. 2001-243984

(51) Int. Cl.
H01L 29/04 (2006.01)

(52) U.S. Cl. ....... 257/72; 257/71; 257/84; 257/E25.015; 349/38; 349/42

(58) Field of Classification Search ............... 257/71, 257/72, 83, 85, E25.014, E25.015; 349/38, 349/42
See application file for complete search history.

(56) References Cited

U.S. PATENT DOCUMENTS

| | | | |
|---|---|---|---|
| 3,506,851 A | 4/1970 | Polkinghorn | |
| 3,898,479 A | 8/1975 | Proebsting | |
| 4,390,803 A | 6/1983 | Koike | |
| 4,412,139 A | 10/1983 | Horninger | |
| 5,870,071 A | 2/1999 | Kawahata | |
| 5,889,291 A | 3/1999 | Koyama | |
| 5,942,856 A | 8/1999 | Koyama | |
| 5,949,271 A | 9/1999 | Fujikura | |
| 6,333,661 B1 | 12/2001 | Ando et al. | |
| 6,362,798 B1 | 3/2002 | Kimura | |
| 6,563,270 B1 | 5/2003 | Koyama | |
| 6,774,479 B2 | 8/2004 | Schatzler | |
| 7,211,961 B2 | 5/2007 | Koyama | |
| 2003/0117352 A1 | 6/2003 | Kimura | |
| 2003/0132931 A1 | 7/2003 | Kimura | |
| 2003/0137503 A1 | 7/2003 | Kimura | |
| 2003/0142520 A1 | 7/2003 | Kimura | |
| 2003/0174009 A1 | 9/2003 | Kimura | |
| 2003/0193492 A1 | 10/2003 | Koyama | |
| 2007/0196959 A1 | 8/2007 | Koyama | |

FOREIGN PATENT DOCUMENTS

| | | |
|---|---|---|
| JP | 52006457 A | 1/1977 |
| JP | 55-156427 | 12/1980 |
| JP | 56068032 A | 6/1981 |
| JP | 59148431 A | 8/1984 |
| JP | 61081229 | 5/1986 |
| JP | 03078313 A | 4/1991 |
| JP | 08271860 A | 10/1996 |
| JP | 2000098338 A | 4/2000 |
| KR | 1998-064793 | 10/1998 |
| KR | 2000-067310 | 11/2000 |
| KR | 2001-003990 | 1/2001 |

*Primary Examiner* — Matthew E Warren
(74) *Attorney, Agent, or Firm* — Fish & Richardson P.C.

(57) ABSTRACT

Solved is a problem of attenuation of output amplitude due to a threshold value of a TFT when manufacturing a circuit with TFTs of a single polarity. In a capacitor (105), a charge equivalent to a threshold value of a TFT (104) is stored. When a signal is inputted thereto, the threshold value stored in the capacitor (105) is added to a potential of the input signal. The thus obtained potential is applied to a gate electrode of a TFT (101). Therefore, it is possible to obtain the output having a normal amplitude from an output terminal (Out) without causing the amplitude attenuation in the TFT (101).

26 Claims, 13 Drawing Sheets

--PRIOR ART--

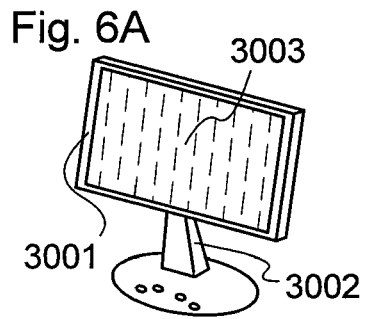
Fig. 6A
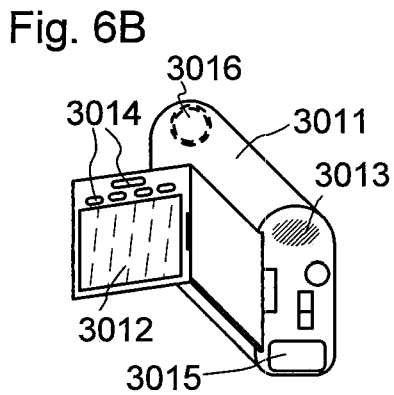
Fig. 6B
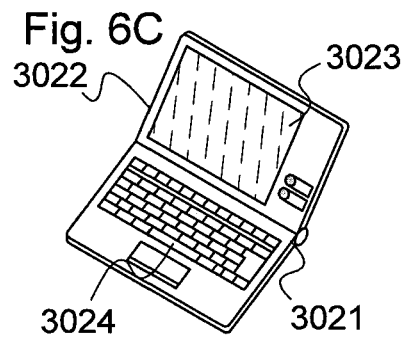
Fig. 6C
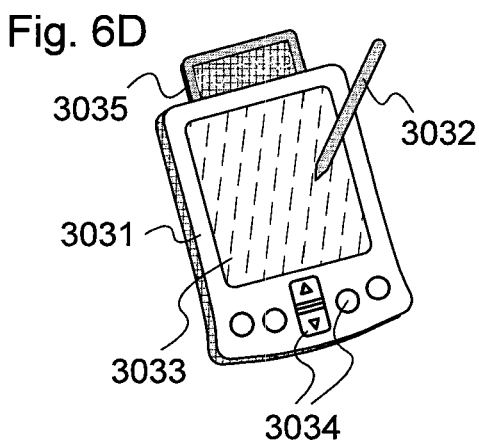
Fig. 6D
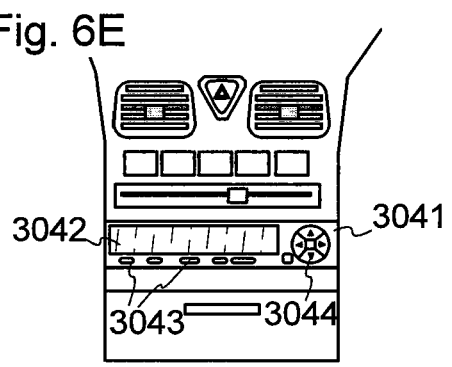
Fig. 6E
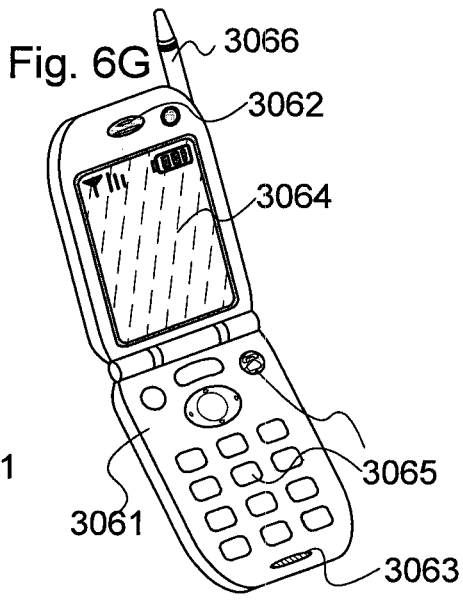
Fig. 6F
Fig. 6G

--PRIOR ART--

SEMICONDUCTOR DEVICE

CROSS-REFERENCE TO RELATED APPLICATIONS

This application is a continuation of U.S. application Ser. No. 10/914,081, filed Aug. 10, 2004, now allowed, which is a continuation of U.S. application Ser. No. 10/198,693, filed Jul. 16, 2002, now U.S. Pat. No. 6,774,419, which claims the benefit of a foreign priority application filed in Japan as Serial No. 2001-243984 on Aug. 10, 2001, all of which are incorporated by reference.

BACKGROUND OF THE INVENTION

1. Field of the Invention

The present invention relates to a semiconductor device having thin film transistors (hereinafter, referred to as TFTs) formed on an insulating surface of glass, plastics, or the like. In particular, included in the semiconductor devices are pulse output circuits such as a shift register circuit, latch circuit, buffer circuit, and level shift circuit, and amplification circuits such as an amplifier, each being used as a driver circuit of a display device.

2. Description of the Related Art

In recent years, a display device having a semiconductor thin film formed on an insulator such as a glass substrate, in particular, an electronic circuit manufactured with TFTs is used in various fields. The electronic circuit is often used in a display device. Active matrix display devices such as an LCD (liquid crystal display) are used in many products and widely spread. In the active matrix display device formed with TFTs, several hundred thousands to several millions of pixels are arranged in a matrix form, and a charge at each pixel is controlled by the TFT disposed at each pixel to thereby display an image.

As a further updated technique, a polysilicon TFT technique is being developed in which on the substrate a driver circuit is formed in a peripheral region of a pixel portion by using TFTs simultaneously with the pixel portion including pixel TFTs which constitute pixels. This greatly contributes to reduction in size and lowering of power consumption of the device, and accordingly such a display device is becoming indispensable to a display unit and the like provided in a mobile information terminal whose application field is notably widened in recent years.

Incidentally, in recent years, the display device is adopted in a display unit of various electronic equipments, and its industrial field is steadily expanding. Recently, it has been actively adopted in relatively inexpensive electronic equipments, and further reduction in costs is thus desired.

In general, in a semiconductor device, a CMOS circuit is adopted in which both n-channel TFTs and p-channel TFTs are used in combination. A display device has a multilayer structure with manufacturing steps of: film formation; exposure with photomasks; and etching are repeated. The steps are extremely complicated, and manufacturing costs thus increase. In addition, in a case of integrally forming the driver circuit and the pixel portion on the substrate as described above, yield is intensely affected by the steps since the defect of a part leads to the defect of a product as a whole.

A method of reducing manufacturing costs comprises reducing the number of steps as much as possible and manufacturing a device in a simple way as well as in a short period of time. Here, a display device is manufactured not with the CMOS structure but with a structure with TFTs of a single polarity in which either n-channel TFTs or p-channel TFTs are used, as a driver circuit structure. Thus, the number of steps of doping an impurity which imparts a conductivity type to semiconductor layers can be mathematically reduced to half, and further, the number of photomasks can also be reduced, which is effective to a great extent. Moreover, the manufacturing steps become simpler with a contribution to an improvement of yield.

FIG. 2 shows an example of an inverter formed of two n-channel TFTs. The inverter is of a dual input type in which signals are inputted to gate electrodes of TFTs 201 and 202, and an inverted signal of an input signal of one TFT is the input of the other TFT.

An operation of the inverter shown in FIG. 2 is now simply explained. It should be noted that in this specification, on explaining a structure and operation of a circuit, different names are appropriately given to three electrodes of a TFT, that is, "gate electrode, input electrode, and output electrode" or "gate electrode, source region, and drain region". When the operation of the TFT is explained, a gate-source voltage is considered in many cases. However, it is difficult to make a rigid distinction between the source region and the drain region of the TFT due to its structure. If unified names are given thereto, confusion may be caused on contrary. That is the reason why the different names are used here. When the input/output of a signal is explained, the electrodes are referred to as input electrode and output electrode. When the gate-source voltage or the like of the TFT is explained, one of the input electrode and the output electrode is referred to as source region, and the other as drain region.

Further, "a TFT is ON" means a state in which the absolute value of the gate-source voltage of the TFT exceeds a threshold voltage with a current flowing between the source and the drain. On the other hand, "a TFT is OFF" means a state in which the absolute value of the gate-source voltage of the TFT does not reach a threshold voltage with no current flowing between the source and the drain. As to the threshold value, for the sake of simple explanation, it is assumed that there is no fluctuation in respective TFTs. Threshold values of n-channel TFTs are uniformly set to VthN, and threshold values of p-channel TFTs are uniformly set to VthP.

First, when H level is inputted to an input terminal (In) and L level is inputted to an inverted input terminal (Inb), the TFT 201 is turned OFF and the TFT 202 is turned ON. Then, L level appears at an output terminal (Out) and its voltage becomes VSS. On the other hand, when L level is inputted to the input terminal (In) and H level is inputted to the inverted input terminal (Inb), the TFT 201 is turned ON and the TFT 202 is turned OFF. Then, H level appears at the output terminal (Out).

At this time, a potential at the time when the output terminal (Out) becomes H level is considered.

In FIG. 2, when H level is inputted to the gate electrode of the TFT 201, L level is inputted to the gate electrode of the TFT 202. Then, the TFT 201 is turned ON, the TFT 202 is turned OFF, and thus, the potential of the output terminal (Out) begins to increase. When the potential of the output terminal (Out) reaches (VDD−VthN), the gate-source voltage of the TFT 201 becomes equal to the threshold value VthN. That is, at this moment, the TFT 201 is turned OFF so that the potential of the output terminal (Out) cannot increase any further.

A case is considered in which inverters are connected in a plurality of stages, as shown in FIG. 12A. Among the inverters of FIG. 12A, only an initial inverter (InvA) is of such a single input and single output type as shown in FIG. 12B. Each of subsequent inverters (InvB) is of such a dual input and single output type as shown in FIG. 12C in order to suppress a shoot-through current at the time of the circuit operation as much as possible. It should be noted here that a gate electrode of a TFT 1201 is connected to a high potential side power supply VDD and remains in an ON state as long as the gate-source voltage of the TFT 1201 becomes lower than the threshold value. Therefore, even when a TFT 1202 is turned ON, it is possible to obtain L level output by setting a current ability of the TFT 1202 larger than that of the TFT 1201, though the output does not become completely equal to VSS.

In such a case, even when an amplitude of the input signal is in a range of VDD to VSS, the amplitude may be attenuated after passing through the stages of inverters one after another due to an influence of the threshold values of the TFTs 1201 and 1211, as shown in FIG. 12D.

SUMMARY OF THE INVENTION

The present invention has been made in view of the above, and an object of the present invention is therefore to provide a circuit which is formed of TFTs of a single polarity and which is capable of operating without causing such amplitude attenuation of an output signal as described above.

To solve the above problems, the present invention employs the following measures.

In an inverter shown in FIG. 2, the cause of generation of output amplitude attenuation is as follows. That is, when L level is inputted to an input terminal (In) and H level is inputted to an inverted input terminal (Inb), a potential applied to a gate electrode of a TFT 201 is equal to a potential on the input electrode side of the TFT 201, that is, a high potential side power supply VDD. Therefore, a potential of an output terminal (Out) is only allowed to increase up to (VDD−VthN).

In other words, when H level appears at the output terminal (Out), in order to obtain a state in which its potential is equal to VDD, the potential applied to the gate electrode of the TFT 201 needs to be higher than VDD, or to be precise, higher than (VDD+VthN).

Therefore, in the present invention, to solve the above problems, a capacitor means is employed to store a charge equivalent to a threshold voltage of the TFT 201 in advance. When a signal is inputted thereto, the charge thus stored is added to the input signal, whereby the potential applied to the gate electrode of the TFT 201 is raised to (VDD+VthN).

According to the present invention, there is provided a semiconductor device comprising first to fourth transistors and a capacitor means, characterized in that:

the first to fourth transistors each have the same conductivity type;

a first electrode of the capacitor means is electrically connected to a first signal input terminal, and a second electrode of the capacitor means is electrically connected to a gate electrode of the first transistor;

a gate electrode of the second transistor is electrically connected to a second signal input terminal;

an input electrode of the first transistor is electrically connected to a first power supply, and an output electrode of the first transistor is electrically connected to a signal output terminal;

an input electrode of the second transistor is electrically connected to a second power supply, and an output electrode of the second transistor is electrically connected to the signal output terminal;

a gate electrode and an output electrode of the third transistor each are electrically connected to the signal output terminal, and an input electrode of the third transistor is electrically connected to the second electrode of the capacitor means; and a gate electrode and an output electrode of the fourth transistor each are electrically connected to the second electrode of the capacitor means, and an input electrode of the fourth transistor is electrically connected to the first electrode of the capacitor means.

In addition, according to the present invention, there is provided a semiconductor device comprising first to fourth transistors and a capacitor means, characterized in that:

the first to fourth transistors each have the same conductivity type;

a first electrode of the capacitor means is electrically connected to a first signal input terminal, and a second electrode of the capacitor means is electrically connected to a gate electrode of the first transistor;

a gate electrode of the second transistor is electrically connected to a second signal input terminal;

an input electrode of the first transistor is electrically connected to a first power supply, and an output electrode of the first transistor is electrically connected to a signal output terminal;

an input electrode of the second transistor is electrically connected to a second power supply, and an output electrode of the second transistor is electrically connected to the signal output terminal;

a gate electrode and an output electrode of the third transistor each are electrically connected to the signal output terminal, and an input electrode of the third transistor is electrically connected to the second electrode of the capacitor means; and a gate electrode of the fourth transistor is electrically connected to the second electrode of the capacitor means, an input electrode of the fourth transistor is electrically connected to the first electrode of the capacitor means, and an output electrode of the fourth transistor is electrically connected to the signal output terminal.

According to the present invention, the capacitor means is a capacitor means storing a threshold voltage of the fourth transistor, and it is characterized in that the stored voltage is added to a potential of a signal inputted from the first signal input terminal, and the thus obtained potential is applied to the gate electrode of the first transistor. With this structure, a gate-source voltage of the first transistor is at least the threshold value all the time, making it possible to obtain the output without causing the amplitude attenuation.

Further, according to the present invention, it is characterized in that the semiconductor device is consist of transistors of a single polarity, i.e., consist of only n-channel transistors or only p-channel transistors. With this structure, it is possible to simplify manufacturing steps of a display device.

In a display device of the present invention, the capacitor means may be formed of a capacitance between the gate electrode and the input electrode of the fourth transistor, or formed of two materials selected from the group consisting of an active layer material, a material for forming a gate electrode, and a wiring material, and an insulating layer between the two materials.

In the display device of the present invention, it is characterized in that a signal inputted to the second signal input terminal is obtained by inverting the polarity of a signal inputted to the first signal input terminal. With this structure, when a signal appearing at the output terminal is either H level or L level, no shoot-through current is generated between a power supply VDD and a power supply VSS in a circuit, making it possible to reduce the consumption current.

BRIEF DESCRIPTION OF THE DRAWINGS

In the accompanying drawings:

FIGS. 6A to 6G are diagrams showing examples of electronic devices to which the present invention can be applied;

DETAILED DESCRIPTION OF THE PREFERRED EMBODIMENTS

Embodiment Mode

Figure 1A:
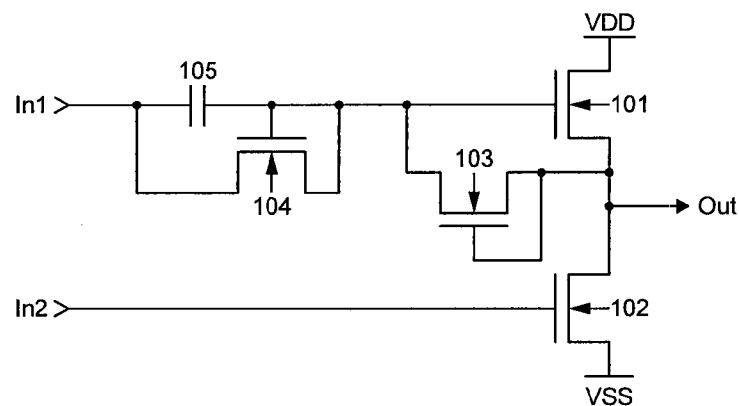
FIGS. 1A and 1B are diagrams for explaining a circuit structure and operation of an embodiment mode of the present invention.
Figure 1B:
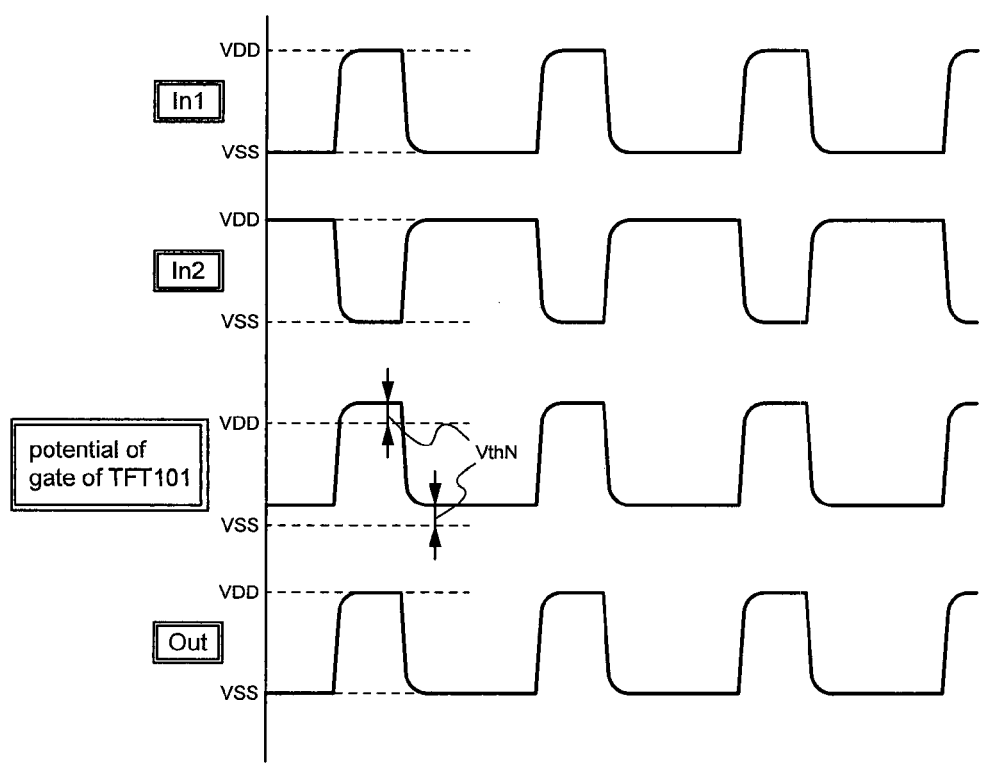
Figure 2:
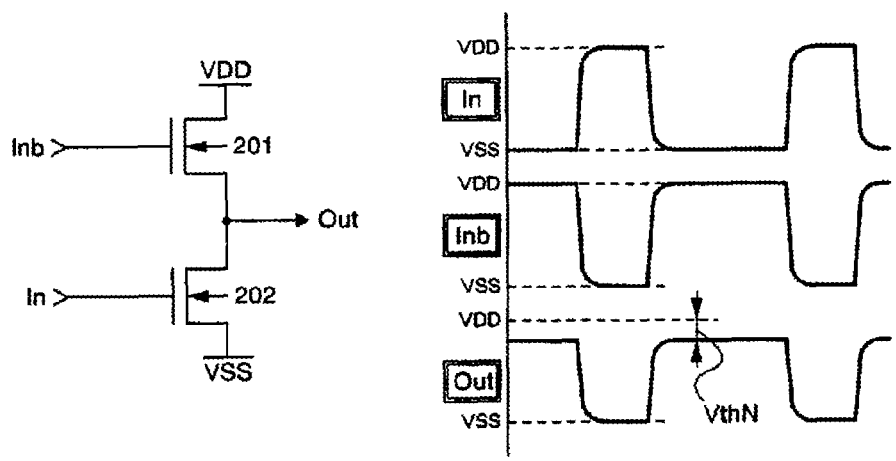
FIG. 2 is a diagram for explaining an inverter formed of TFTs of a single polarity and an operation thereof.

A fundamental circuit structure of the present invention is shown in FIG. 1A. The circuit operates in the same manner as an inverter shown in FIG. 2, and is of a dual input and single output type. A signal, which is obtained by inverting the polarity of a signal inputted to an input terminal (In), appears at an output terminal (Out).

The circuit is structured by TFTs 101 to 104 and a capacitor means 105.

Figure 3A:
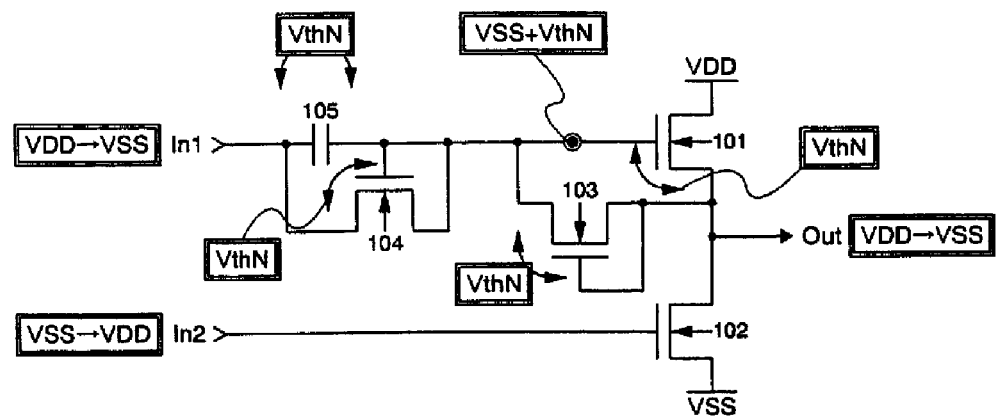
FIGS. 3A and 3B are diagrams for explaining a potential at each node at the time of the circuit operation in the embodiment mode of the present invention.
Figure 3B:
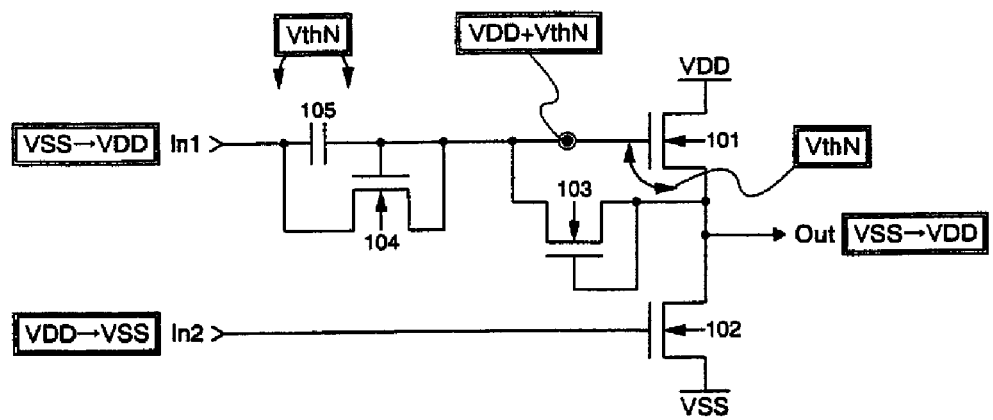

An operation of the circuit is explained. In FIGS. 3A and 3B, a potential at each node at the time of the circuit operation is shown. First, when L level is inputted to a first input terminal (In1) and H level is inputted to a second input terminal (In2), the TFT 102 is turned ON, and a potential of the output terminal (Out) begins to decrease toward VSS. At this point, the potential of the output terminal (Out) has not lowered yet to reach L level, and the TFT 103 thus remains in an ON state. Then, a current flows from the output terminal (Out) to the capacitor means 105, and a potential applied to a gate electrode of the TFT 104 increases. Therefore, the TFT 104 is also turned ON. As the potential of the output terminal (Out) further decreases, a gate-source voltage of the TFT 103 becomes equal to VthN, with the TFT 103 being turned OFF. At this point, even when the TFT 104 is still in an ON state, a charge accumulated in the capacitor means 105 is discharged through the TFT 104. Then, a gate-source voltage of the TFT 104 continuously decreases so that the TFT 104 will be turned OFF before long.

With this structure, a threshold voltage VthN of the TFT 104 is stored in the capacitor means 105. At the first input terminal (In1), L level appears and its potential is VSS. Thus the potential applied to the gate electrode of the TFT 101 is higher than VSS by a voltage stored in the capacitor means 105. That is, the potential at this time applied to the gate electrode of the TFT 101 is (VSS+VthN). Since L level appears at the output terminal (Out) and its potential is VSS, a gate-source voltage of the TFT 101 is VthN, and the TFT 101 is turned OFF (FIG. 3A).

Further, an operation of the circuit is explained when H level is inputted to the first input terminal (In1) and L level is inputted to the second input terminal (In2). First, at the second input terminal (In2), H level is switched to L level, and the TFT 102 is turned OFF. On the other hand, at the first input terminal (In1), L level is switched to H level. At this time, the TFT 103 remains in an OFF state so that no transfer of the charge stored in the capacitor means 105 occurs. As to the TFT 104, a potential of a source region thereof increases, whereas a gate-source voltage is VthN as it stands, the TFT 104 remaining in an OFF state. Therefore, even when L level is switched to H level at the first input terminal (In1), the voltage between both electrodes of the capacitor means 105 is still stored. Accordingly, since the potential of the first input terminal (In1) increases to VDD from VSS, the potential applied to the gate electrode of the TFT 101 increases to (VDD+VthN) from (VSS+VthN). Therefore, H level appears at the output terminal (Out) with its potential being equal to VDD (FIG. 3B).

In accordance with the operation descried above, it is possible to normally obtain from the signal input having an amplitude in a range of VDD to VSS, the output having the amplitude in the same range without the amplitude attenuation. As a result, it is possible to manufacture the semiconductor device formed of the TFTs of a single polarity with employing the methods described above. This contributes to the reduction in the number of manufacturing steps as well as in manufacturing costs.

EMBODIMENTS

Embodiments of the present invention are described below.

Embodiment 1

Figure 4:
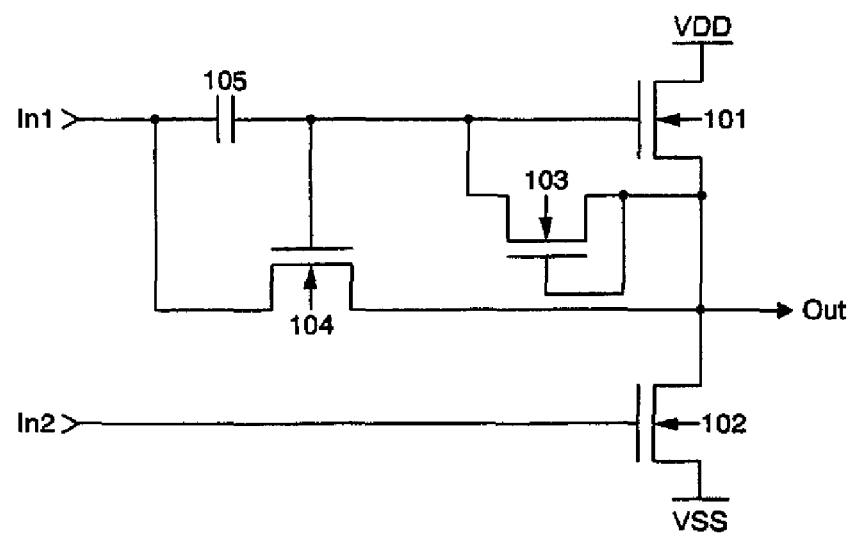
FIG. 4 is a diagram showing an embodiment of the present invention with a different structure from that of the embodiment mode.

FIG. 4 shows a circuit structure in which connections of the circuit shown in FIG. 1A are partially modified. In FIG. 1A, the output electrode of the TFT 104 is connected to the gate electrode of the TFT 101, whereas it is connected to the output terminal (Out) in FIG. 4.

An operation of the circuit is the same as described in the embodiment mode so that no explanation thereof is given here. The gate electrode of the TFT 101 is now considered in the circuit structure. In the circuit shown in FIG. 1A, even after the TFT 103 is turned OFF, the charge can be transferred through the TFT 104 to some extent. However, in the circuit shown in FIG. 4, no transfer passage exists for the charge accumulated in the gate electrode of the TFT 101 when the TFT 103 is turned OFF. If a fluctuation is supposed to be generated in threshold values of the TFTs which form the circuit, there is a possibility that the gate-source voltage of the TFT 101 does not sufficiently decrease to the level equal to the threshold value of the TFT 101. In consideration of the above, by setting a current ability of the TFT 102 larger than that of the TFT 101, it is possible to obtain the normal L level output even when the TFT 101 is not completely turned OFF.

Embodiment 2

In the following, a method of simultaneously manufacturing TFTs of driving circuit portions provided in the pixel portion and the periphery thereof on the same substrate is described. Although the step of manufacturing a liquid crystal display device is shown in this embodiment, the present invention is not limited to the liquid crystal display device as mentioned above.

Figure 7A:
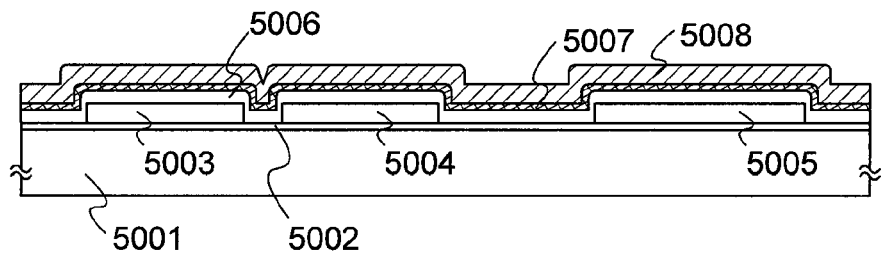
FIGS. 7A to 7C are diagrams showing an example of manufacturing steps of a liquid crystal display device.

First, as shown in FIG. 7A, a base film 5002 made of an insulating film such as a silicon oxide film, a silicon nitride film, or a silicon nitride oxide film is formed on a substrate 5001 made of glass such as barium borosilicate glass or alumino borosilicate glass, typified by #7059 glass or #1737 glass of Corning Inc. For example, not shown in figures particularly, a silicon nitride oxide film fabricated from $SiR_4$, $NH_3$ and $N_2O$ by a plasma CVD method is formed with a thickness of 10 to 200 nm (preferably 50 to 100 nm), and a hydrogenated silicon nitride oxide film similarly fabricated from $SiH_4$ and $N_2O$ is formed with a thickness of 50 to 200 nm (preferably 100 to 150 nm) to form a lamination.

Island-like semiconductor layers 5003 to 5005 are formed of a crystalline semiconductor film manufactured by using a laser crystallization method on a semiconductor film having an amorphous structure, or by using a known thermal crystallization method. The thickness of the island-like semiconductor films 5003 to 5005 is set from 25 to 80 nm (preferably between 30 and 60 nm). There is no limitation on the crystalline semiconductor film material, but it is preferable to form the film from silicon or a silicon germanium (SiGe) alloy.

A laser such as a pulse oscillation type or continuous emission type excimer laser, a YAG laser, or a $YVO_4$ laser is used for manufacturing the crystalline semiconductor film in the laser crystallization method. A method of condensing laser light emitted from a laser oscillator into a linear shape by an optical system and then irradiating the light to the semiconductor film may be employed when these types of lasers are used. The crystallization conditions may be suitably selected by the operator, but the pulse oscillation frequency is set to 30 Hz, and the laser energy density is set from 100 to 400 $mJ/cm^2$ (typically between 200 and 300 $mJ/cm^2$) when using the excimer laser. Further, the second harmonic is utilized when using the YAG laser, the pulse oscillation frequency is set from 1 to 10 kHz, and the laser energy density may be set from 300 to 600 $mJ/cm^2$ (typically between 350 and 500 $mJ/cm^2$). The laser light which has been condensed into a linear shape with a width of 100 to 1000 μm, for example 400 μm, is then irradiated over the entire surface of the substrate. This is performed with an overlap ratio of 80 to 98%.

Next, a gate insulating film 5006 is formed covering the island-like semiconductor layers 5003 to 5005. The gate insulating film 5006 is formed of an insulating film containing silicon with a thickness of 40 to 150 nm by a plasma CVD method or a sputtering method. A 120 nm thick silicon nitride oxide film is formed in this embodiment. The gate insulating film is not limited to such a silicon nitride oxide film, of course, and other insulating films containing silicon may also be used, in a single layer or in a lamination structure. For example, when using a silicon oxide film, it can be formed by the plasma CVD method with a mixture of TEOS (tetraethyl orthosilicate) and $O_2$, at a reaction pressure of 40 Pa, with the substrate temperature set from 300 to 400° C., and by discharging at a high frequency (13.56 MHz) with electric power density of 0.5 to 0.8 $W/cm^2$. Good characteristics of the silicon oxide film thus manufactured as a gate insulating film can be obtained by subsequently performing thermal annealing at 400 to 500° C.

A first conductive film 5007 and a second conductive film 5008 are then formed on the gate insulating film 5006 in order to form gate electrodes. In this Embodiment, the first conductive film 5007 is formed from tantalum (Ta) with a thickness of 50 to 100 nm, and the second conductive film 5008 is formed from tungsten (W) with a thickness of 100 to 300 nm (FIG. 7A).

The Ta film is formed by sputtering, which a Ta target is sputtered by using Ar. If an appropriate amount of Xe or Kr is added to the Ar during sputtering, the internal stress of the Ta film will be relaxed, and film peeling can be prevented. The resistivity of an α phase Ta film is on the order of 20 μΩcm, and the α phase Ta film can be used for the gate electrode, but the resistivity of β phase Ta film is on the order of 180 μΩcm and the β phase Ta film is unsuitable for the gate electrode. The α phase Ta film can easily be obtained if a tantalum nitride (TaN) film, which possesses a crystal structure near that of α phase Ta, is formed with a thickness of 10 to 50 nm as a base for Ta in order to form the α phase Ta film.

The W film is formed by sputtering with Was a target. The W film can also be formed by a thermal CVD method using tungsten hexafluoride ($WF_6$). Whichever is used, it is necessary to make the film low resistant in order to use it as the gate electrode, and it is preferable that the resistivity of the W film be set 20 μΩcm or less. The resistivity can be lowered by enlarging the crystal grain of the W film, but for cases where there are many impurity elements such as oxygen within the W film, crystallization is inhibited, and the film becomes high resistant. Therefore, a W target having a purity of 99.9999% is thus used in sputtering. In addition, by forming the W film while taking sufficient care such that no impurities from the inside of the gas phase are introduced at the time of film formation, a resistivity of 9 to 20 μΩcm can be achieved.

Note that although the first conductive film 5007 and the second conductive film 5008 are formed from Ta and W, respectively, in this embodiment, the conductive films are not limited to these. Both the first conductive film 5007 and the second conductive film 5008 may also be formed from an element selected from the group consisting of Ta, W, Mo, Al, and Cu, or from an alloy material or a chemical compound material having one of these elements as its main constituent. Further, a semiconductor film, typically a polysilicon film, into which an impurity element such as phosphorous is doped, may also be used. Examples of preferable combinations other than that in this embodiment include: the first conductive film formed from TaN and the second conductive film formed from W; the first conductive film formed from TaN and the second conductive film formed from Al; and the first conductive film formed from TaN and the second conductive film formed from Cu.

Next, a mask 5009 is formed from resist, and a first etching process is performed in order to form electrodes and wirings. An ICP (inductively coupled plasma) etching method is used in this embodiment. A gas mixture of $CF_4$ and $Cl_2$ is used as an etching gas, and a plasma is generated by applying a 500 W RF electric power (13.56 MHz) to a coil shape electrode at 1 Pa. A 100 W RF electric power is also applied to the substrate side (test sample stage), effectively applying a negative self-bias voltage thereto. The W film and the Ta film are both etched on the same order when $CF_4$ and $Cl_2$ are mixed as the etching gas.

Edge portions of the first conductive layer and the second conductive layer are made into a tapered shape by using a suitable resist mask shape and the effect of the bias voltage applied to the substrate side with the above etching conditions. The angle of the tapered portions is from 15 to 45°. The etching time may be increased by approximately 10 to 20% in order to perform etching without leaving any residue on the gate insulating film. The selectivity of a silicon nitride oxide film with respect to a W film is from 2 to 4 (typically 3), and therefore approximately 20 to 50 nm of the exposed surface of the silicon nitride oxide film is etched by this over-etching process. First shape conductive layers 5010 to 5013 are thus formed of the first conductive layers 5010a to 5013a and the second conductive layers 5010b to 5013b by the first etching process. At this point, regions of the gate insulating film 5006 not covered by the first shape conductive layers 5010 to 5013 are made thinner by approximately 20 to 50 nm by etching (FIG. 7B).

Figure 7B:
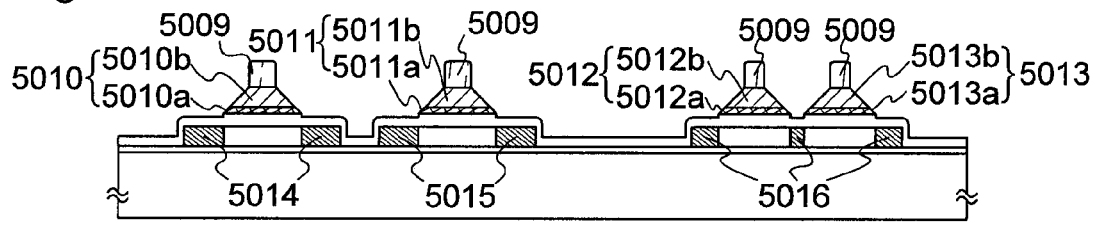

Then, a first doping process is performed to add an impurity element for imparting an n-type conductivity (FIG. 7B). Doping may be carried out by an ion doping method or an ion injecting method. The condition of the ion doping method is that a dosage is $1 \times 10^{13}$ to $5 \times 10^{14}$ atoms/cm$^2$, and an acceleration voltage is 60 to 100 keV. As the impurity element for imparting the n-type conductivity, an element belonging to group 15, typically, phosphorus (P) or arsenic (As) is used, but phosphorus is used here. In this case, the conductive layers 5010 to 5013 become masks to the impurity element to impart the n-type conductivity, and first impurity regions 5014 to 5016 are formed in a self-aligning manner. The impurity element to impart the n-type conductivity in the concentration range of $1 \times 10^{20}$ to $1 \times 10^{21}$ atoms/cm$^3$ is added to the first impurity regions 5014 to 5016.

Figure 7C:
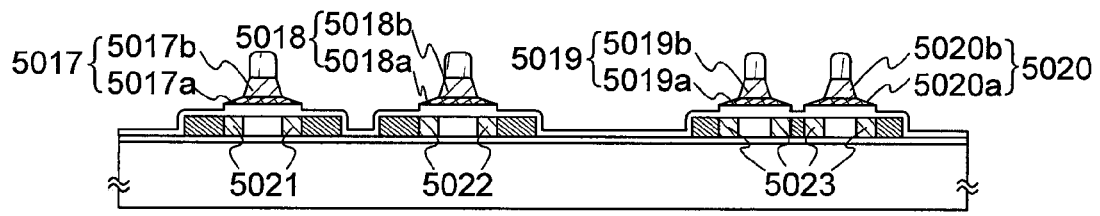

Next, as shown in FIG. 7C, a second etching process is performed. The ICP etching method is similarly used, so that $CF_4$, $Cl_2$ and $O_2$ are mixed with an etching gas, and RF electric power of 500 W is supplied to the coil shape electrode at a pressure of 1 Pa to generate plasma. RF electric power of 50 W is supplied to the substrate side (test sample stage), and a lower self-bias voltage in comparison with the self-bias voltage in the first etching process is applied to thereon. Anisotropic etching of a W film as the second conductive layer is performed under such a condition, and anisotropic etching of the Ta film as the first conductive layer is performed at an etching speed slower than that of the anisotropic etching of the W film so that a second shape conductive layers 5017 to 5020 (first conductive layers 5017a to 5020a and second conductive layers 5017b to 5020b) are formed. A region of the gate insulating film 5006 which is not covered with the second shape conductive layers 5017 to 5020 is further etched by about 20 to 50 [nm] so that a thinned region is formed.

An etching reaction of the W film or the Ta film by the mixture gas of $CF_4$ and $Cl_2$ can be guessed from a generated radical or ion species and the vapor pressure of a reaction product. When the vapor pressures of fluoride and chloride of W and Ta are compared with each other, the vapor pressure of $WF_6$ being fluoride of W is extremely high, and other $WCl_5$, $TaF_5$, and $TaCl_5$ have almost equal vapor pressures. Thus, in the mixture gas of $CF_4$ and $Cl_2$, both the W film and the Ta film are etched. However, when a suitable amount of $O_2$ is added to this mixture gas, $CF_4$ and $O_2$ react with each other to form CO and F, and a large number of F radicals or F ions are generated. As a result, an etching rate of the W film having the high vapor pressure of fluoride is increased. On the other hand, with respect to Ta, even if F is increased, an increase of the etching rate is relatively small. Besides, since Ta is easily oxidized as compared with W, the surface of Ta is oxidized by addition of $O_2$. Since the oxide of Ta does not react with fluorine or chlorine, the etching rate of the Ta film is further decreased. Accordingly, it becomes possible to make a difference between the etching rates of the W film and the Ta film, and it becomes possible to make the etching rate of the W film higher than that of the Ta film.

Then, as shown in FIG. 7C, a second doping process is performed. In this case, a dosage is made lower than that of the first doping process and under the condition of a high acceleration voltage, an impurity element for imparting the n-type conductivity is doped. For example, the process is carried out with an acceleration voltage set to 70 to 120 keV and at a dosage of $1 \times 10^{13}$ atoms/cm$^2$, so that new impurity regions are formed inside of the first impurity regions formed into the island-like semiconductor layers in FIG. 7B. Doping is carried out such that the second conductive layers 5017b to 5020b are used as masks to the impurity element and the impurity element is added also to the regions under the first conductive layers 5017a to 5020a. In this way, second impurity regions 5021 to 5023 overlapping with the first conductive layers are formed.

Figure 8A:
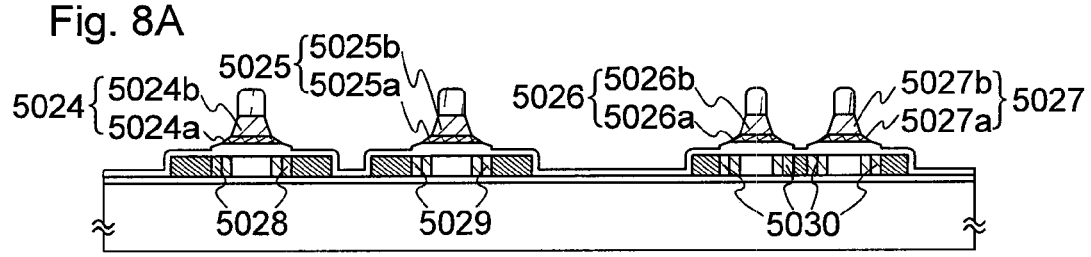
FIGS. 8A to 8C are diagrams showing an example of manufacturing steps of a liquid crystal display device.

As shown in FIG. 8A, a third etching process is performed. $Cl_2$ is used as an etching gas here, and the third etching process is performed by ICP etching device. In this embodiment, the etching is performed for 70 seconds under the condition that a gas flow rate of $Cl_2$ is set to 60 sccm and RF electric power of 350 W is supplied to the coil shape electrode at a pressure of 1 Pa to generate plasma. RF electric power is also supplied to the substrate side (test sample stage), substantially the negative self-bias voltage is applied thereof. According to the third etching process, the first conductive layers are reduced whereby forming third shape conductive layers 5024 to 5027 (first conductive layers 5024a to 5027a and second conductive layers 5024b to 5027b). At this point, a part of the second impurity regions 5021 to 5023 is third impurity regions 5028 to 5030, which are not overlapping with the first conductive layers.

Impurity regions are formed into the respective island-like semiconductor layers by the above mentioned step. The third shape conductive layers 5024 to 5027 overlapping with the island-like semiconductor films function as a gate electrode of TFTs.

A step of activating the impurity elements added in the respective island-like semiconductor layers for the purpose of controlling the conductivity type is conducted. This step is carried out by a thermal annealing method using a furnace annealing oven. In addition, a laser annealing method or a rapid thermal annealing method (RTA method) can be applied. The thermal annealing method is performed in a nitrogen atmosphere having an oxygen concentration of 1 ppm or less, preferably 0.1 ppm or less and at 400 to 700° C., typically 500 to 600° C. In this embodiment, a heat treatment is conducted at 500° C. for four hours. However, in the case where a wiring material used for the third shape conductive layers 5024 to 5027 is weak to heat, it is preferable that the activation is performed after an interlayer insulating film (containing silicon as its main constituent) is formed to protect the wiring line or the like.

Further, a heat treatment at 300 to 450° C. for 1 to 12 hours is conducted in an atmosphere containing hydrogen of 3 to 100%, and a step of hydrogenating the island-like semiconductor layers is conducted. This step is a step of terminating dangling bonds in the semiconductor layer by thermally excited hydrogen. As another means for thermal hydrogenation, plasma hydrogenation (using hydrogen excited by plasma) may be carried out.

Figure 8B:
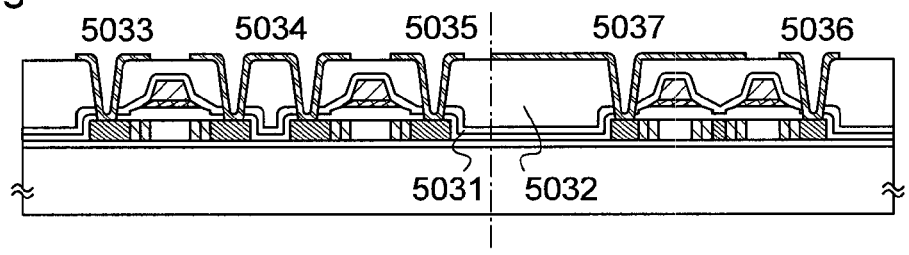

Next, as shown in FIG. 8B, a first interlayer insulating film 5031 made of a silicon nitride oxide film having a thickness of 100 to 200 nm is formed. A second interlayer insulating film 5032 made of an organic insulating material formed thereon.

Contact holes are then formed with respect to the first interlayer insulating film 5031, the second interlayer insulating film 5032, and the gate insulating film 5006, films are formed by wiring material, respective wirings 5033 to 5036 are formed by patterning, and then, a pixel electrode 5037 is formed by patterning.

Next, the film made from organic resin is used for the second interlayer insulating film 5032. As the organic resin, polyimide, polyamide, acryl, BCB (benzocyclobutene) or the like can be used. Especially, since the second interlayer insulating film 5032 has rather the meaning of flattening, acryl excellent in flatness is desirable. In this embodiment, an acryl film is formed to such a thickness that stepped portions formed by the TFTs can be adequately flattened. The thickness is preferably made 1 to 5 μm (more preferably 2 to 4 μm).

In the formation of the contact holes, dry etching or wet etching is used, and contact holes reaching the n-type impurity regions 5014 to 5016, a contact hole reaching a source signal line (not illustrated), a contact hole reaching a gate signal line (not illustrated), a contact hole reaching a power supply line, and contact hole reaching the gate electrodes 5024 to 5026 (not illustrated) are formed, respectively.

Further, the wirings 5033 to 5036 are formed by patterning into a desired shape a film consisting of a three layer laminate in which a 100 nm thick Ti film, a 300 nm thick Al film containing Ti, and a 150 nm thick Ti film are continuously formed by sputtering. Other conductive materials may of course be used. The pixel electrode 5037 is formed of a material having a high reflectivity when a display device is of a reflection type. In this case, it may be formed simultaneously with the wirings. On the other hand, in a case of a transmission type display device, the pixel electrode 5037 is formed of a transparent conductive material such as indium tin oxide (ITO). In this specification, the substrate which has reached the state shown in FIG. 8B through conducting steps is referred to as active matrix substrate.

Then, an opposing substrate 5038 is prepared. A light shielding film 5039 is formed on the opposing substrate 5038. The light shielding film is made of chrome (Cr) or the like with a thickness of 100 to 200 nm.

On the other hand, an opposing electrode 5040 is formed in the pixel portion. The opposing electrode is made of a transparent conductive material such as ITO. Further, a film thickness of the opposing electrode is desirably 100 to 120 nm to keep the transmission of visible light high.

On the active matrix substrate and the opposing substrate, orientation films 5041 and 5042 are formed. It is preferred that the orientation films 5041 and 5042 have a thickness of 30 to 80 nm. As the orientation film, SE7792 manufactured by Nissan Chemical Industries, Ltd. may be used for example. By using an orientation film with a high pretilt angle, it is possible to suppress the generation of disclination at the time of driving the liquid crystal display device driven with the active matrix method.

Then, the orientation films 5041 and 5042 are rubbed. Preferably, the direction of rubbing shows the counterclockwise TN (twisted nematic) orientation when the liquid crystal display device is completed.

Though not particularly shown in Embodiment 2, spacers may be formed in pixels by dispersion or patterning, thereby improving cell gap uniformity. In Embodiment 2, a photosensitive resin film is formed and is then subjected to patterning to form the spacers with a height of 4.0 μm.

Further, the active matrix substrate and the opposing substrate are bonded to each other with a sealant 5043. As the sealant, there is used XN-21S manufactured by Mitsui Chemicals which is of a thermosetting type. In the sealant, a filler is mixed. The height of the filler is 4.0 μm. After the sealant is cured, the active matrix substrate and the opposing substrate are simultaneously cut into a desired size.

Subsequently, liquid crystal 5044 is injected. As the liquid crystal material, one having the low viscosity is preferred in consideration of high speed responsibility and the like. In Embodiment 2, nematic liquid crystal is used with which the orientation control is easily performed. Needless to say, high speed responsive ferroelectric liquid crystal or antiferroelectric liquid crystal may be used.

Figure 8C:
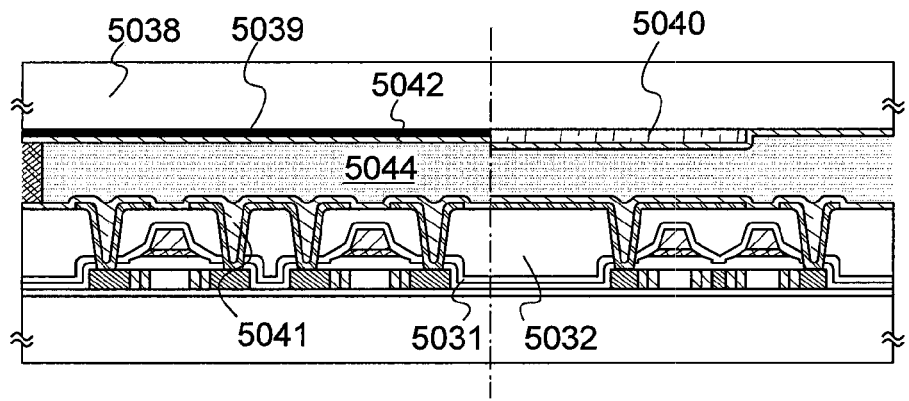

After the injection of liquid crystal, an injection inlet is sealed with UV setting resin or the like. Then, a polarizing plate is attached employing a known method. Finally, a connector (flexible printed circuit: FPC) is mounted with which terminals drawn from elements or circuits formed on the substrate and external signal terminals are connected, thereby completing the product (FIG. 8C). In this specification, the product in such a state that it is ready for shipment as described above is referred to as liquid crystal display device.

In accordance with the steps shown in Embodiment 2, only four photomasks are required to form the active matrix substrate (that is, island-like semiconductor layer pattern, first wiring pattern (gate wiring, island-like source wiring, and capacitor wiring), contact hole pattern, and second wiring pattern (which includes pixel electrode and connection electrode). As a result, the number of steps can be reduced, contributing to the reduction in manufacturing costs and improvement of yield.

Figure 5A:
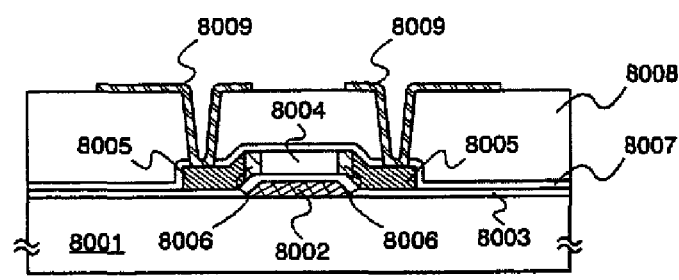
FIGS. 5A and 5B are diagrams for explaining sectional structures of a bottom gate type TFT and a dual gate type TFT.
Figure 5B:
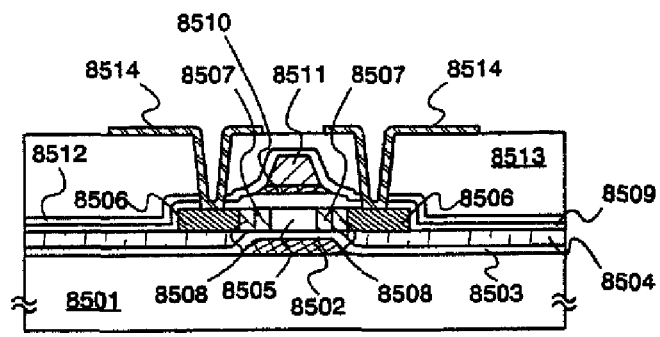

In Embodiment 2, the top gate type TFT is explained as an example. In addition, the embodiment can be implemented by using a bottom gate type TFT including a gate electrode formed below an active layer, as shown in FIG. 5A, or a dual gate type TFT containing gate electrodes vertically located so as to sandwich an active layer therebetween, as shown in FIG. 5B.

Embodiment 3

The steps shown in Embodiment 2 are explained as an example of a case in which pixels and peripheral driver circuits are formed of n-channel TFTs. However, it is possible to implement the present invention by using p-channel TFTs.

In the case of n-channel TFTs, an impurity region, which is called overlap region, is provided in a region overlapping a gate electrode to inhibit the hot carrier degradation etc. On the other hand, in the case of p-channel TFTs, an influence due to the hot carrier degradation is small so that there is no need to particularly provide the overlap region. In this case, the pixels and peripheral driver circuits can be manufactured through simpler steps.

Figure 9A:
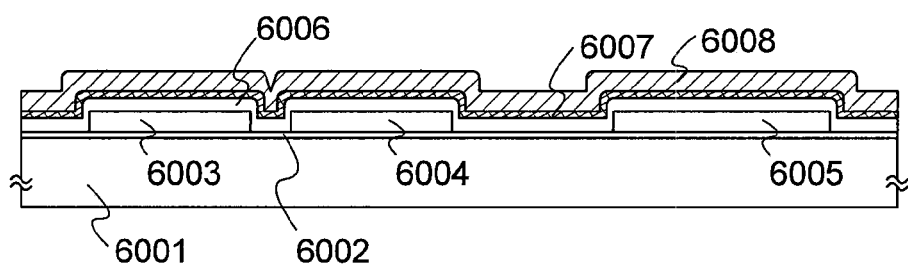
FIGS. 9A to 9C are diagrams showing an example of manufacturing steps of an active matrix substrate including a circuit formed of p-channel TFTs.

As shown in FIG. 9A, according to Embodiment 2, a base film 6002 is formed on an insulating substrate 6001 made of glass or the like. Then, island-like semiconductor layers 6003 to 6005, a gate insulating film 6006, and conductive layers 6007 and 6008 are formed thereon. Although the conductive layers 6007 and 6008 are laminated here, they may be a composed of a single layer.

Figure 9B:
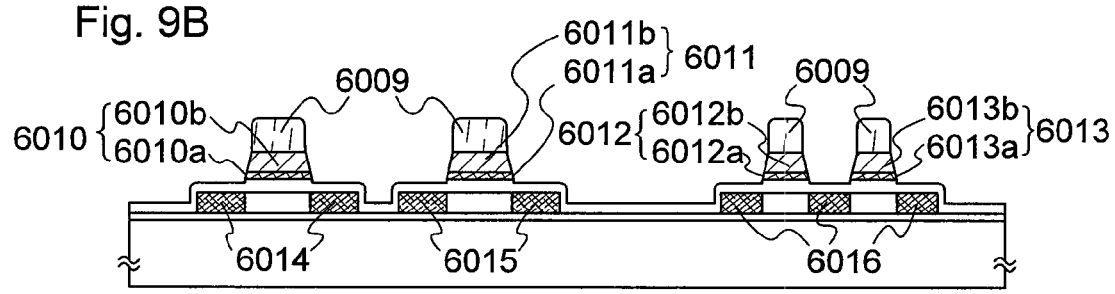

Then, as shown in FIG. 9B, resist masks 6009 are formed to conduct first etching processing. In Embodiment 2, anisotropic etching is performed with utilization of a selection ratio between materials of the laminated conductive layers. However, since there is no need to provide a region functioning as an overlap region in this example, normal etching may be alternatively performed. At this time, in the gate insulating film 6006 there is formed a region which is thinned by about 20 to 50 nm due to etching in comparison with other regions.

Subsequently, first doping processing is conducted to dope an impurity element which imparts p-type conductivity to the island-like semiconductor layers. Conductive layers 6010 to 6013 are used as masks against the impurity element, and impurity regions are formed in a self-aligning manner. Boron (B) or the like is representative of the impurity element imparting p-type conductivity. In this example, the impurity regions are formed by ion doping with diborane ($B_2H_6$) such that the semiconductor layers have the impurity concentration of $2\times10^{20}$ to $2\times10^{21}$ atoms/cm$^3$.

Figure 9C:
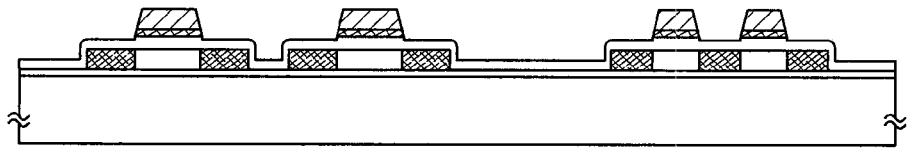

The resist masks are removed to obtain the state shown in FIG. 9C. From this stage, the pixels and peripheral driver circuits are manufactured in accordance with the step shown in FIG. 8B of Embodiment 2 and the subsequent steps. Thus, the present invention can be implemented by using the p-channel TFTs.

The circuit structure is similar to the structure with the n-channel TFTs as shown in FIG. 1A. However, the power supply has different connections from those of FIG. 1A in which the high potential side power supply VDD and the low potential side power supply VSS are switched.

Embodiment 4

In Embodiment 4, manufacturing steps of a light emitting device which uses in a pixel portion a light emitting element such as an electroluminescent (EL) element.

In accordance with the manufacturing steps shown in Embodiment 2, a state in which first and second interlayer insulating films are formed so far is obtained, as shown in FIGS. 8A and 8B.

Figure 10A:
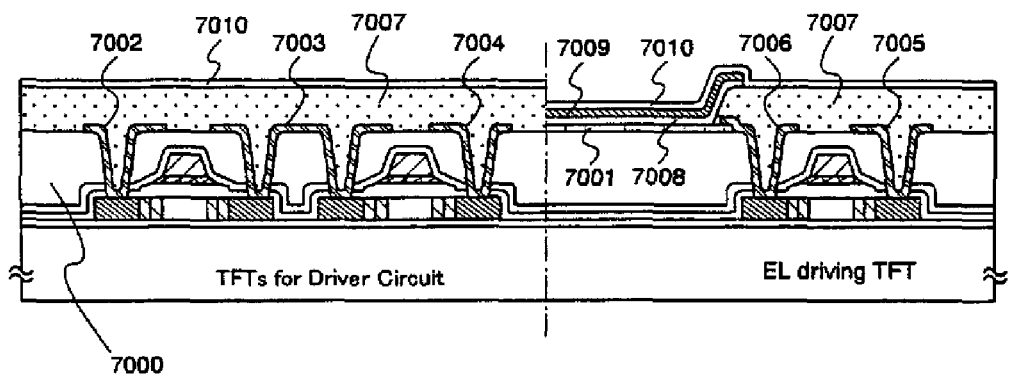
FIGS. 10A and 10B are diagrams showing an example of manufacturing steps of a light emitting device.

Then, contact holes are opened, as shown in FIG. 10A. The contact holes are formed by dry etching or wet etching so as to reach the impurity region, source signal line, gate signal line, current supply line, and gate electrode, respectively.

An anode 7001 of the EL element is formed by depositing a transparent conductive film represented by an ITO film and patterning it into a desired shape. A laminate film consisting of Ti layer, Al layer containing Ti, and Ti layer is formed, and it is patterned into a desired shape, forming wiring electrodes 7002 to 7005 and a pixel electrode 7006. The thickness of the respective layers may be the same as in Embodiment 2. The pixel electrode 7006 is formed so as to overlap the anode 7001 formed in the earlier stage, thereby establishing a contact therebetween.

Next, a third interlayer insulating film 7007 is formed by preparing an insulating film made of, for example, an organic resin material such as acrylic and forming an opening portion at a position corresponding to the anode 7001 of the EL element. It is preferred that the opening portion is formed to have gently tapered side walls. If the tapered shape of the side walls of the opening portion is not sufficiently gentle, degradation and cut step of the EL layer due to the existence of steps become serious problems so that attentions should be given thereto.

After forming an EL layer 7008, a cathode 7009 of the EL element is formed of cesium (Cs) with a thickness of 2 nm or less and silver (Ag) with a thickness of 10 nm or less. By making the film of the cathode 7009 of the EL element extremely thin, light generated at the EL layer is transmitted through the cathode 7009 to be emitted.

Subsequently, a protective film 7010 is formed for the protection of the EL element. Thereafter, attachment of an FPC and other operations are conducted, thus completing the light emitting device.

Figure 10B:
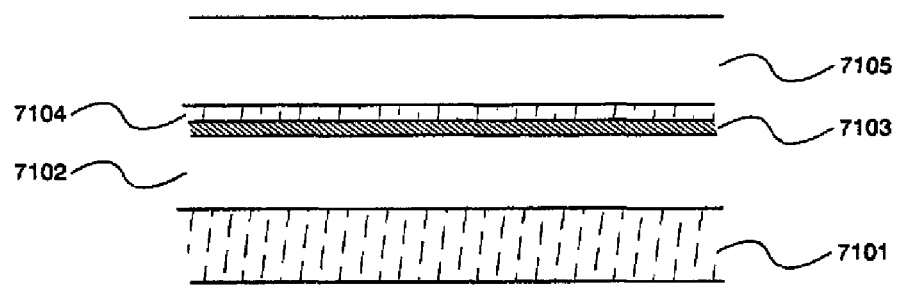

FIG. 10B shows a detailed structure of the EL element in the light emitting device shown in FIG. 10A according to Embodiment 4. An anode 7101 of the EL element is made of a transparent conductive film represented by an ITO film. Reference numeral 7102 denotes an EL layer containing a light emitting layer. A cathode of the EL element is made of a Cs film 7103 and an Ag film 7104, each of which is formed extremely thin. Denoted by reference numeral 7105 is a protective film.

By making a region of the EL element on the cathode side extremely thin, light generated at the EL layer 7102 is transmitted through the Cs film 7103 and the Ag film 7104 forming the cathode to be emitted upward. That is, the region where TFTs are formed does not overwhelm the area of the light emitting surface so that the aperture ratio can be set to almost 100%.

In this example, the emission direction of light faces the side where the cathode is formed. If it is not desired that the light transmission is made toward the side of the anode made of ITO, it is preferred that a second interlayer insulating film 7000 is formed of an opaque film colored in block or the like.

In the above steps, there is described the structure in which the cathode is formed just above the EL layer and the anode is formed just under the EL layer. If the pixel electrode under the EL layer is made of TiN etc., and the electrode above the EL layer is made of ITO etc., it is possible to arrange the anode just above the EL layer and the cathode just under the EL layer.

The following structure may also be adopted, though the aperture ratio is slightly lowered. The anode is arranged just under the EL layer, the cathode is arranged just above the EL layer, the electrode under the EL layer is made of ITO etc., and the electrode above the EL layer is made of MaAg etc., which is different form Embodiment 4, whereby light generated at the EL layer is emitted toward the substrate side where the TFTs are formed, or downward.

Embodiment 5

In Embodiment 5, steps of manufacturing a light emitting device in a different manner from that of Embodiment 4 are described.

In accordance with the manufacturing steps shown in Embodiment 2, the state in which the first and second interlayer insulating films are formed so far is obtained, as shown in FIGS. 8A and 8B.

Figure 11A:
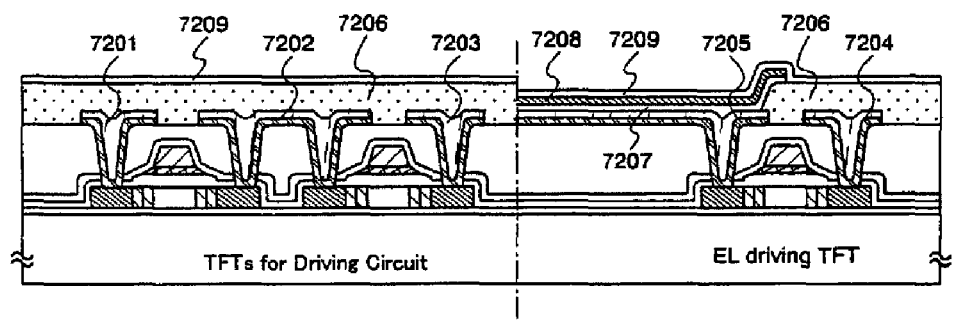
FIGS. 11A and 11B are diagrams showing an example of manufacturing steps of a light emitting device.

Then, contact holes are opened, as shown in FIG. 11A. The contact holes are formed by dry etching or wet etching so as to reach the n-type impurity region, source signal line, gate signal line, current supply line, and gate electrode, respectively.

Next, wirings 7201 to 7204 are formed, and a pixel electrode 7205, which serves as the anode of the EL element, is formed as a laminate film which consists of Ti film, Al film containing Ti, Ti film, and transparent conductive film.

Then, a third interlayer insulating film 7206 is formed by preparing an insulating film made of, for example, an organic resin material such as acrylic and forming an opening portion at a position corresponding to the anode 7205 of the EL element. It is preferred that the opening portion is formed to have gently tapered side walls. If the tapered shape of the side walls of the opening portion is not sufficiently gentle, degradation and cut step of the EL layer due to the existence of steps become serious problems so that attentions should be given thereto.

After forming an EL layer 7207, a cathode 7208 of the EL element is formed of cesium (Cs) with a thickness of 2 nm or less and silver (Ag) with a thickness of 10 nm or less. By making the film thickness of the cathode 7208 of the EL element extremely thin, light generated at the EL layer is transmitted through the cathode 7208 to be emitted.

Subsequently, a protective film 7209 is formed for protection of the EL element. Thereafter, attachment of an FPC and other operations are conducted, thus completing the light emitting device.

Figure 11B:
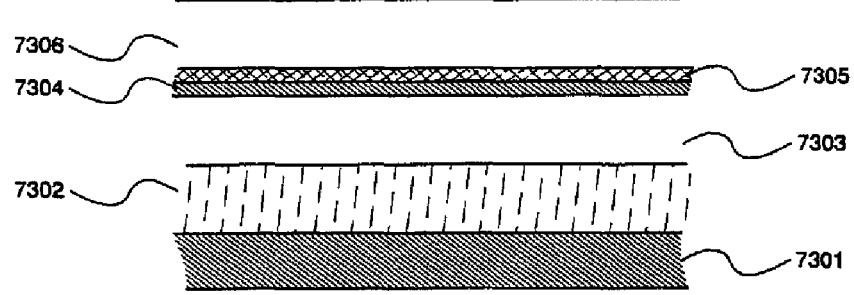
Figure 12A:
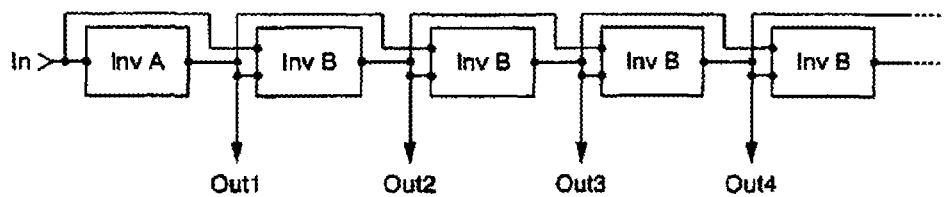
FIGS. 12A to 12D are diagrams for explaining a structure in which inverters consisting of TFTs of a single polarity are connected in a plurality of stages and an operation thereof.
Figure 12B:
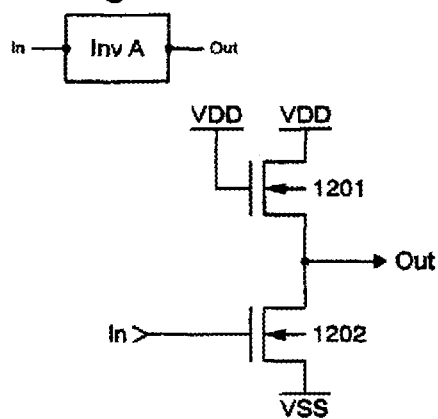
Figure 12C:
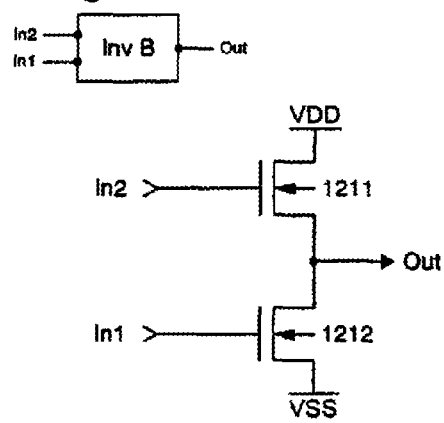
Figure 12D:
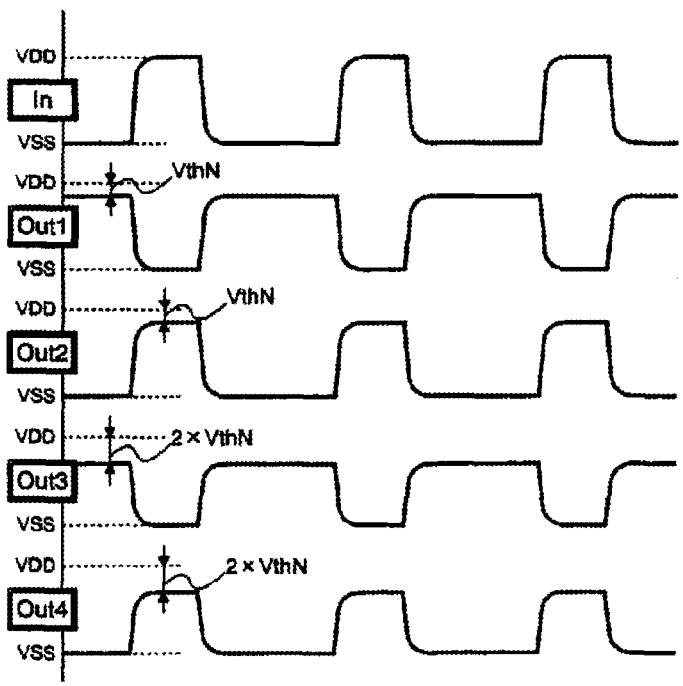

FIG. 11B shows a detailed structure of the EL element in the light emitting device shown in FIG. 11A according to Embodiment 5. An anode of the EL element is made of a metal film 7301 made of the laminate of Ti, Al, and Ti films, and a transparent conductive film 7302 represented by is an ITO film. Reference numeral 7303 denotes an EL layer containing a light emitting layer. A cathode of the EL layer is made of a Cs film 7304 and an Ag film 7305, each of which is formed extremely thin. Denoted by reference numeral 7306 is a protective film.

In the light emitting device manufactured in accordance with Embodiment 5, the aperture ratio can be advantageously set to nearly 100%, as in the display device of Embodiment 4 described below. Further, when forming wiring electrodes and pixel electrodes, it is possible to perform patterning on the metal film made of the laminate including Ti film, Al film, and Ti film, and on the transparent conductive film with a common photomask. Thus, it is possible to reduce the number of photomasks and simplify the manufacturing steps.

In the above steps, there is described the structure in which the cathode is formed just above the EL layer, the anode is formed just under the EL layer. If the pixel electrode under the EL layer is made of TiN etc., and the electrode above the EL layer is made of ITO etc., it is possible to arrange the anode just above the EL layer and the cathode just under the EL layer.

The following structure may also be adopted, though the aperture ratio is slightly lowered. The anode is arranged just under the EL layer, the cathode is arranged just above the EL layer, the electrode under the EL layer is made of ITO etc., and the electrode above the EL layer is made of MaAg etc., which is different form Embodiment 5, whereby light generated at the EL layer is emitted toward the substrate side where the TFTs are formed, or downward.

Embodiment 6

The present invention can be implemented by using p-channel TFTs. In Embodiment 6, the structure and operation are explained.

Figure 13A:
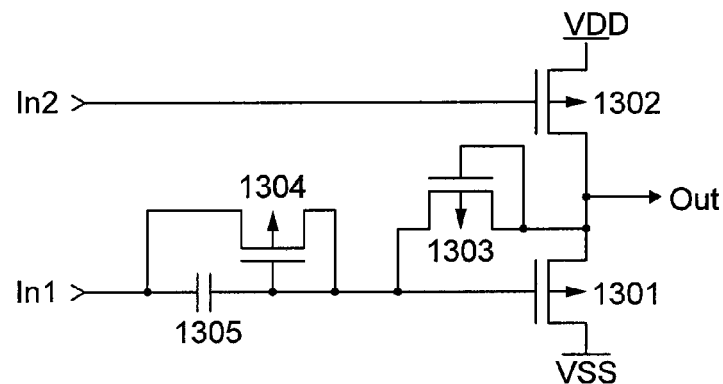
FIGS. 13A and 13B are diagrams showing an example of a driver circuit of the present invention, which is consisting of p-channel TFTs.
Figure 13B:
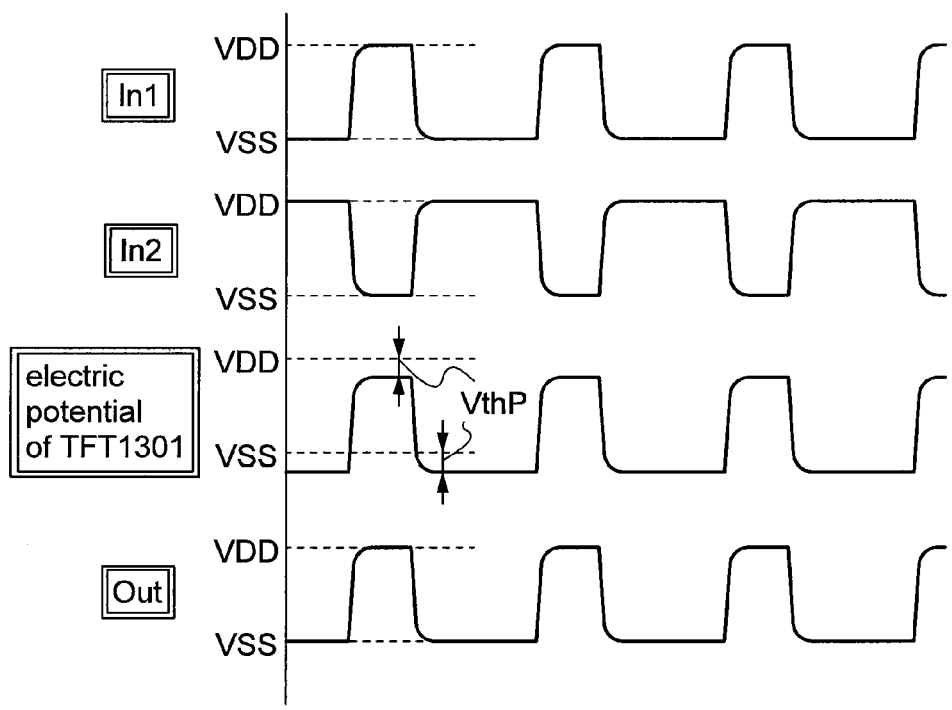

FIG. 13A shows a structure of a circuit. The circuit is a dual input and single output type inverter structured by TFTs 1301 to 1304 and a capacitor means 1305. A signal obtained by inverting the polarity of a signal inputted to an input terminal (In) appears at an output terminal (Out).

An operation of the circuit is explained. First, when H level is inputted to a first input terminal (In1) and L level is inputted to a second input terminal (In2), then the TFT 1302 is turned ON, and the potential of the output terminal (Out) begins to increase toward VDD. At this time, the potential of the output terminal (Out) does not reach as high as H level, the TFT 1303 thus remains in an ON state. A current flows from the capacitor means 1305 toward the output terminal (Out), a potential applied to a gate electrode of the TFT 1304 decreases, and the TFT 1304 is also turned ON. As the potential of the output terminal (Out) further increases, a gate-source voltage of the TFT 1303 becomes equal to VthP, with the TFT 1303 being turned OFF. At this point, even when the TFT 1304 is still in an ON state, a charge accumulated in the capacitor means 1305 is discharged through the TFT 1304. Then, a gate-source voltage of the TFT 1304 continuously decreases so that the TFT 1304 will be turned OFF before long.

With this structure, a threshold voltage VthP of the TFT 1304 is stored in the capacitor means 1305. At the first input terminal (In1), H level appears and its potential is VDD. Thus the potential applied to the gate electrode of the TFT 1301 is lower than VDD by a voltage stored in the capacitor means 1305. That is, the potential applied to the gate electrode of the TFT 1301 is (VDD−VthP) at this time. Since H level appears at the output terminal (Out) and its potential is VDD, the gate-source voltage of the TFT 1301 is VthP, and the TFT 1301 is turned OFF.

Further, an operation of the circuit is explained when L level is inputted to the first input terminal (In1) and H level is inputted to the second input terminal (In2). First, at the second input terminal (In2), L level is switched to H level, and the TFT 1302 is turned OFF. On the other hand, at the first input terminal (In1), H level is switched to L level. At this time, the TFT 1303 remains in an OFF state so that no transfer of the charge stored in the capacitor means 1305 occurs. As to the TFT 1304, a potential of a source region thereof decreases, whereas a gate-source voltage is VthP as it stands, the TFT 1304 remaining in an OFF state. Therefore, even when H level is switched to L level at the first input terminal (In1), the voltage between both electrodes of the capacitor means 1305 is still stored. Accordingly, since the potential applied to the first input terminal (In1) decreases to VSS from VDD, the potential applied to the gate electrode of the TFT 1301 decreases to (VSS−VthP) from (VDD−VthP). Thus, L level appears at the output terminal (Out) with its potential being equal to VSS.

In accordance with the operation descried above, even when the circuit is structured by p-channel TFTs, it is possible to normally obtain, from the signal input having an amplitude in a range of VDD to VSS, the output having the amplitude in the same range without the amplitude attenuation.

Embodiment 7

The present invention can be applied to manufacturing the display device of various electric equipments. As such electronic equipments, there are pointed out a portable information terminal (electronic book, mobile computer, cellular phone of the like), a video camera, digital camera, a personal computer, a television, a cellular phone and the like. Example of these are shown in FIGS. 6A to 6G.

FIG. 6A illustrates a liquid crystal display or OLED display constituted by a casing 3001, a support stand 3002, a display portion 3003 or the like. The present invention can be applied to the display portion 3003.

FIG. 6B illustrates a video camera constituted by a main body 3011, a display portion 3012, a audio input portion 3013, operation switches 3014, a battery 3015, an image receiving portion 3016 or the like. The present invention can be applied to the display portion 3012.

FIG. 6C illustrates a notebook personal computer constituted by a main body 3021, a casing 3022, a display portion 3023, a keyboard 3024 or the like. The present invention can be applied to the display portion 3023.

FIG. 6D illustrates a portable information terminal, constituted by a main body 3031, a stylus 3032, a display portion 3033, operation switches 3034, a external interface 3035 or the like. The present invention can be applied to the display portion 3033.

FIG. 6E illustrates an audio reproduction device, more specifically an audio device mounted in a motor vehicle and constituted by a main body 3041, a display portion 3042, operation switches 3043 and 3044 or the like. The present invention can be applied to the display portion 3042. The invention may be applied to any of portable or home audio devices other than the above-described audio device mounted in a motor vehicle.

FIG. 6F illustrates a digital camera constituted by a main body 3051, a display portion (A) 3052, an ocular portion 3053, operation switches 3054, a display portion (B) 3055, a battery 3056 or the like. The present invention can be applied to each of the display portion (A) 3052 and the display portion (B) 3055.

FIG. 6G illustrates a cellular phone constituted by a main body 3061, an audio output portion 3062, an audio input portion 3063, a display portion 3064, operating switches 3065, an antenna 3066 or the like. The present invention can be applied to the display portion 3064.

Note that the above-described devices of this embodiment are only examples and that the invention is not exclusively applied to them.

With the circuit of the present invention, it is possible to normally obtain, from the signal input having an amplitude in a range of VDD to VSS, the output having the amplitude in the same range without the amplitude attenuation. Therefore, it is possible to manufacture the driver circuit of the display device with the TFTs of a single polarity in accordance with the methods described above. This contributes to the reduction in the number of the manufacturing steps and the lowering of the manufacturing costs.

What is claimed is:

1. A semiconductor device comprising:
   first, second, and third transistors and a capacitor;
   wherein the first, second, and third transistors are the same conductivity type,
   wherein a first electrode of the capacitor is electrically connected to a gate of the first transistor,
   wherein a gate of the second transistor is electrically connected to a first signal input terminal,
   wherein one of source and drain of the first transistor and one of source and drain of the third transistor are directly connected to a signal output terminal,
   wherein one of source and drain of the second transistor is electrically connected to a first power supply line, and the other one of source and drain of the second transistor is electrically connected to the signal output terminal, and
   wherein the other one of source and drain of the third transistor is directly connected to the first electrode of the capacitor.

2. A semiconductor device according to claim 1, wherein a second electrode of the capacitor is electrically connected to a second signal input terminal.

3. A semiconductor device according to claim 1, wherein the other one of source and drain of the first transistor is electrically connected to a second power supply line.

4. A semiconductor device according to claim 1, wherein a gate of the third transistor and the other one of the source and the drain of the third transistor are electrically connected to each other.

5. A semiconductor device according to claim 1, further comprising a fourth transistor, wherein a gate and one of source and drain of the fourth transistor are electrically connected to the first electrode of the capacitor, and the other one of source and drain of the fourth transistor is electrically connected to a second electrode of the capacitor.

6. A semiconductor device according to claim 1, wherein said capacitor has a function of adding a voltage stored in said capacitor to a signal which is inputted from a second signal input terminal and is inputted to the gate of said first transistor.

7. A semiconductor device according to claim 1, wherein said conductivity type is an n-channel type.

8. A semiconductor device according to claim 1, wherein said conductivity type is a p-channel type.

9. A semiconductor device according to claim 1, wherein said capacitor is formed of a capacitance between the gate and one of a source and a drain of a fourth transistor.

10. A semiconductor device according to claim 1, wherein said capacitor is formed of two materials selected from the group consisting of an active layer material, a material for forming a gate electrode, and a wiring material, and an insulating layer between said two materials.

11. A semiconductor device according to claim 1, wherein a signal inputted to said first signal input terminal is obtained by inverting the polarity of a signal inputted to a second signal input terminal.

12. A display device comprised of the semiconductor device claim 1.

13. A display device according to claim 12, wherein the display device is applied to electric equipment selected from the group consisting of a liquid crystal display, an OLED display, a video camera, a notebook personal computer, a portable information terminal, an audio reproduction device, a digital camera and a cellular phone.

14. A display device comprising:
   a pixel portion comprising a fifth transistor over a substrate;
   a driver circuit over the substrate comprising first, second, and third transistors and a capacitor;
   wherein a first electrode of the capacitor is electrically connected to a gate of the first transistor,
   wherein a gate of the second transistor is electrically connected to a first signal input terminal,
   wherein one of source and drain of the first transistor and one of source and drain of the third transistor are directly connected to a signal output terminal,
   wherein one of source and drain of the second transistor is electrically connected to a first power supply line, and the other one of source and drain of the second transistor is electrically connected to the signal output terminal, and
   wherein the other one of source and drain of the third transistor is directly connected to the first electrode of the capacitor.

15. A display device according to claim 14, wherein a second electrode of the capacitor is electrically connected to a second signal input terminal.

16. A display device according to claim 14, wherein the other one of source and drain of the first transistor is electrically connected to a second power supply line.

17. A display device according to claim 14, wherein a gate and the other one of the source and the drain of the third transistor are electrically connected to each other.

18. A display device according to claim 14, further comprising a fourth transistor, wherein a gate and one of source and drain of the fourth transistor are electrically connected to the first electrode of the capacitor, and the other one of source and drain of the fourth transistor is electrically connected to a second electrode of the capacitor.

19. A display device according to claim 14, wherein the driver circuit comprises at least a circuit selected from the group consisting of a shift register circuit, a latch circuit, a buffer circuit, a level shift circuit and an amplifier.

20. A display device according to claim 14, wherein the display device is applied to electric equipment selected from the group consisting of a liquid crystal display, an OLED display, a video camera, a notebook personal computer, a portable information terminal, an audio reproduction device, a digital camera and a cellular phone.

21. A liquid crystal display device comprising:
- a pixel portion comprising a fifth transistor and a liquid crystal over a substrate;
- a driver circuit over the substrate comprising first, second, and third transistors and a capacitor;
- wherein the first, second, third, and fifth transistors are the same conductivity type,
- wherein a first electrode of the capacitor is electrically connected to a gate of the first transistor,
- wherein a gate of the second transistor is electrically connected to a first signal input terminal,
- wherein one of source and drain of the first transistor and one of source and drain of the third transistor are directly connected to a signal output terminal,
- wherein one of source and drain of the second transistor is electrically connected to a first power supply line, and the other one of source and drain of the second transistor is electrically connected to the signal output terminal, and
- wherein the other one of source and drain of the third transistor is directly connected to the first electrode of the capacitor.

22. A liquid crystal display device according to claim 21, wherein a second electrode of the capacitor is electrically connected to a second signal input terminal.

23. A liquid crystal display device according to claim 21, wherein the other one of source and drain of the first transistor is electrically connected to a second power supply line.

24. A liquid crystal display device according to claim 21, wherein a gate and the other one of the source and the drain of the third transistor are electrically connected to the each other.

25. A liquid crystal display device according to claim 21, further comprising a fourth transistor, wherein a gate and one of source and drain of the fourth transistor are electrically connected to the first electrode of the capacitor, and the other one of source and drain of the fourth transistor is electrically connected to a second electrode of the capacitor.

26. A liquid crystal display device according to claim 21, wherein the driver circuit comprises at least a circuit selected from the group consisting of a shift register circuit, a latch circuit, a buffer circuit, a level shift circuit and an amplifier.

* * * * *

UNITED STATES PATENT AND TRADEMARK OFFICE
CERTIFICATE OF CORRECTION

| | | |
|---|---|---|
| PATENT NO. | : 8,212,257 B2 | Page 1 of 1 |
| APPLICATION NO. | : 12/630869 | |
| DATED | : July 3, 2012 | |
| INVENTOR(S) | : Hajime Kimura | |

It is certified that error appears in the above-identified patent and that said Letters Patent is hereby corrected as shown below:

Column 17, line 57, in claim 4 before "source" delete "the";

Column 17, line 58, in claim 4 before "drain" delete "the";

Column 17, line 59, in claim 4 replace "each other" with --the signal output terminal--;

Column 18, line 9, in claim 9 before "source" delete "a";

Column 18, line 9, in claim 9 before "drain" delete "a".

Signed and Sealed this
Sixteenth Day of October, 2012

David J. Kappos
*Director of the United States Patent and Trademark Office*